United States Patent
Lostetter

(10) Patent No.: US 9,728,868 B1
(45) Date of Patent: Aug. 8, 2017

(54) APPARATUS HAVING SELF HEALING LIQUID PHASE POWER CONNECTS AND METHOD THEREOF

(71) Applicant: CREE FAYETTEVILLE, INC., Fayetteville, AR (US)

(72) Inventor: Alexander Lostetter, Fayetteville, AR (US)

(73) Assignee: Cree Fayetteville, Inc., Fayetteville, AR (US)

( * ) Notice: Subject to any disclaimer, the term of this patent is extended or adjusted under 35 U.S.C. 154(b) by 361 days.

(21) Appl. No.: 14/176,494

(22) Filed: Feb. 10, 2014

Related U.S. Application Data

(63) Continuation-in-part of application No. 13/068,232, filed on May 5, 2011, now abandoned.

(60) Provisional application No. 61/343,881, filed on May 5, 2010.

(51) Int. Cl.
| | |
|---|---|
| *H05K 7/00* | (2006.01) |
| *H01R 12/52* | (2011.01) |
| *H05K 1/02* | (2006.01) |
| *H05K 1/18* | (2006.01) |
| *H05K 13/00* | (2006.01) |

(52) U.S. Cl.
CPC ........... *H01R 12/52* (2013.01); *H05K 1/0271* (2013.01); *H05K 1/181* (2013.01); *H05K 13/00* (2013.01); *H05K 2201/068* (2013.01); *H05K 2201/10954* (2013.01)

(58) Field of Classification Search
USPC ........ 361/700–710, 752–753, 760–764, 803; 257/700–704
See application file for complete search history.

(56) References Cited

U.S. PATENT DOCUMENTS

| | | | | |
|---|---|---|---|---|
| 4,651,192 | A | * | 3/1987 | Matsushita ........... H01L 23/057 257/704 |
| 4,891,686 | A | | 1/1990 | Krausse, III .................... 357/68 |
| 4,985,753 | A | * | 1/1991 | Fujioka ................. H01L 23/057 257/700 |
| 5,346,859 | A | | 9/1994 | Niwayama ..................... 437/209 |
| 5,417,362 | A | | 5/1995 | Chiyonobu et al. .......... 228/180 |
| 5,514,604 | A | | 5/1996 | Brown ............................ 437/40 |
| 5,604,377 | A | | 2/1997 | Palagonia ..................... 257/685 |
| 5,665,996 | A | | 9/1997 | Williams et al. ............. 257/401 |
| 5,767,567 | A | | 6/1998 | Hu et al. ........................ 257/666 |
| 5,773,362 | A | | 6/1998 | Tonti et al. ................... 438/665 |
| 5,909,056 | A | | 6/1999 | Mertol .......................... 257/704 |
| 6,249,041 | B1 | | 6/2001 | Kasem et al. ................. 257/666 |
| 6,281,573 | B1 | | 8/2001 | Atwood et al. ............... 257/706 |

(Continued)

*Primary Examiner* — Tuan T Dinh
(74) *Attorney, Agent, or Firm* — Baker Hostetler LLP

(57) ABSTRACT

The present invention is directed to a liquid and solid phase power connect for packaging of an electrical device using a using a phase changing metal. The phase changing metal transitions back and forth between a liquid phase and a solid phase while constantly maintaining connection to the electrical device. The packaging uses a substrate, a restraining housing, and a lid to encase an electrical contact on the electrical device and restrain the phase changing metal. In one embodiment, the entire electrical device is encased and a voltage isolator is utilized to limit the contact areas between the phase changing metal and the electrical device. A method for relieving contact stress by transitioning the phase changing metal from a solid to a liquid is also taught.

18 Claims, 2 Drawing Sheets

(56) References Cited

U.S. PATENT DOCUMENTS

| | | | |
|---|---|---|---|
| 6,292,362 B1 * | 9/2001 | O'Neal | H01L 23/42 165/122 |
| 6,410,356 B1 | 6/2002 | Wojnarowski et al. | 438/15 |
| 6,665,186 B1 | 12/2003 | Calmidi et al. | 361/704 |
| 6,793,502 B2 | 9/2004 | Parkhill et al. | 439/66 |
| 6,930,385 B2 | 8/2005 | Hsu et al. | 257/714 |
| 7,057,273 B2 | 6/2006 | Harnden et al. | 257/696 |
| 7,215,012 B2 | 5/2007 | Harnden et al. | 257/676 |
| 7,232,710 B2 | 6/2007 | Hsu et al. | 438/122 |
| 7,332,757 B2 | 2/2008 | Kajiwara et al. | 257/288 |
| 7,369,411 B2 | 5/2008 | Hill et al. | 361/708 |
| 7,394,150 B2 | 7/2008 | Kasem et al. | 257/690 |
| 7,449,370 B2 | 11/2008 | Tanaka | 438/123 |
| 7,485,954 B2 | 2/2009 | Havanur | 257/686 |
| 7,554,190 B2 | 6/2009 | Macris et al. | 257/706 |
| 7,692,316 B2 | 4/2010 | Cao et al. | 257/784 |
| 7,952,192 B2 | 5/2011 | Fann et al. | 257/712 |
| 7,999,363 B2 | 8/2011 | Hebert et al. | 257/666 |
| 8,269,739 B2 | 9/2012 | Hillis et al. | 345/173 |
| 2003/0085475 A1 | 5/2003 | Im et al. | 257/796 |
| 2003/0178730 A1 | 9/2003 | Rumer et al. | 257/778 |
| 2004/0150082 A1 | 8/2004 | Kajiwara et al. | 257/678 |
| 2004/0184239 A1 * | 9/2004 | Zimmerman | H01L 21/50 361/712 |
| 2004/0246682 A1 * | 12/2004 | Osakada | H01L 23/66 361/709 |
| 2004/0253766 A1 * | 12/2004 | Sung | B22F 3/10 438/122 |
| 2005/0191793 A1 * | 9/2005 | Brennan | H01L 23/047 438/125 |
| 2006/0022333 A1 | 2/2006 | Shivkumar et al. | 257/723 |
| 2006/0087026 A1 | 4/2006 | Cao et al. | 257/706 |
| 2007/0164424 A1 | 7/2007 | Dean et al. | 257/707 |
| 2008/0137300 A1 | 6/2008 | Macris et al. | 361/699 |
| 2010/0039446 A1 | 2/2010 | Hillis et al. | 345/629 |
| 2011/0049697 A1 | 3/2011 | Clothier | 257/690 |
| 2011/0079792 A1 | 4/2011 | Lostetter et al. | 257/77 |
| 2012/0127669 A1 | 5/2012 | Cawthon et al. | 361/719 |
| 2013/0082967 A1 | 4/2013 | Hillis et al. | 345/173 |

* cited by examiner

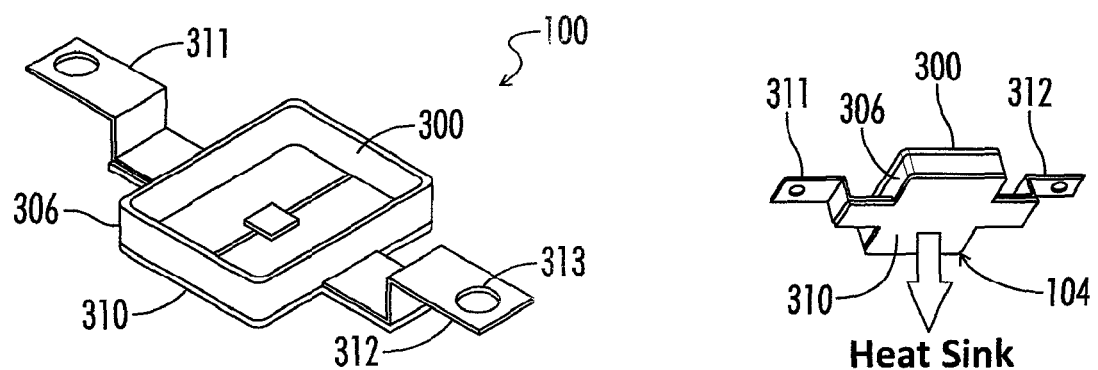
FIG. 1
FIG. 2
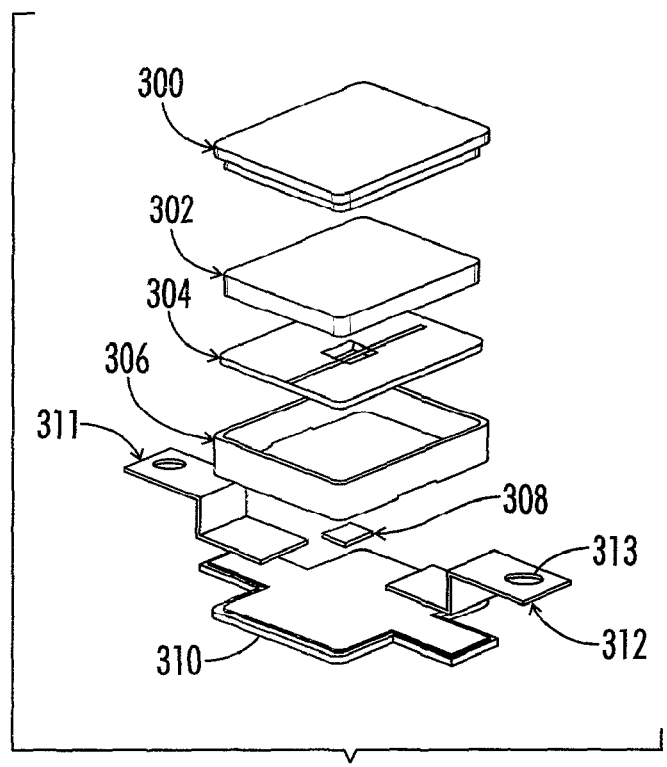
FIG. 3

APPARATUS HAVING SELF HEALING LIQUID PHASE POWER CONNECTS AND METHOD THEREOF

CROSS-REFERENCE TO RELATED APPLICATIONS

This application claims priority to and is a continuation in part of U.S. patent application Ser. No. 13/068,232 filed May 5, 2011 by Losteller entitled Self Healing Liquid Phase Power Connects, which was a continuation in part of and claimed priority to U.S. Provisional Application 61/343,881, filed May 5, 2010 by Lostetter of Fayetteville, Ark. entitled Self Healing Liquid Phase Power Connects.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in packages for integrated power circuits. More particularly, the invention relates to improvements particularly suited for power connects to replace wire bond interconnects in power packaging. In particular, the present invention relates specifically to self-healing phase changing power connections for high temperature operating environments.

2. Description of the Known Art

As will be appreciated by those skilled in the art, integrated circuits and power circuit packages are known in various forms. These include: U.S. Pat. No. 7,232,710, issued to Hsu, et al. on Jun. 19, 2007 entitled Method of making cascaded die mountings with springs-loaded contact-bond options; U.S. Pat. No. 6,793,502, issued to Parkhill, et al. on Sep. 21, 2004 entitled Press (non-soldered) contacts for high current electrical connections in power modules; U.S. Pat. No. 6,930,385, issued to Hsu, et al. on Aug. 16, 2005 entitled Cascaded die mountings with spring-loaded contact-bond options; U.S. Pat. No. 5,604,377, issued to Palagonia on Feb. 18, 1997 entitled Semiconductor chip high density packaging; U.S. Pat. No. 4,891,686, issued to Krausse, III on Jan. 2, 1990 entitled Semiconductor packaging with ground plane conductor arrangement; U.S. Pat. No. 5,514,604, issued to Brown on May 7, 1996 entitled Vertical channel silicon carbide metal-oxide-semiconductor field effect transistor with self-aligned gate for microwave and power applications, and method of making; U.S. Pat. No. 5,665,996, issued to Williams, et al. on Sep. 9, 1997 entitled Vertical power mosfet having thick metal layer to reduce distributed resistance; U.S. Pat. No. 5,767,567, issued to Hu, et al. on Jun. 16, 1998 entitled Design of device layout for integration with power mosfet packaging to achieve better lead wire connections and lower on resistance; U.S. Pat. No. 6,249,041, issued to Kasem, et al. on Jun. 19, 2001 entitled IC chip package with directly connected leads; U.S. Pat. No. 7,057,273, issued to Harnden, et al. on Jun. 6, 2006 entitled Surface mount package; U.S. Pat. No. 7,215,012, issued to Harnden, et al. on May 8, 2007 entitled Space-efficient package for laterally conducting device; U.S. Pat. No. 7,332,757, issued to Kajiwara, et al. on Feb. 19, 2008 entitled MOSFET package; U.S. Pat. No. 7,394,150, issued to Kasem, et al. on Jul. 1, 2008 entitled Semiconductor package including die interposed between cup-shaped lead frame and lead frame having mesas and valleys; U.S. Pat. No. 7,449,370, issued to Tanaka on Nov. 11, 2008, entitled Production process for manufacturing such semiconductor package; and U.S. Pat. No. 7,485,954, entitled Havanur on Feb. 3, 2009 entitled Stacked dual MOSFET package. Each of these patents is incorporated by reference in their entirety.

Typical circuit or chip packages use wire bond interconnects which is one of the main limitations of today's state-of-the-art power interconnects. Wire bond interconnects introduce major inductance parasitics into the power flow; severely limiting switching frequencies, causing di/dt and dv/dt overcurrent and overvoltage waveforms within the power modules, and causing substantial bus ringing that must be minimized via bulky DC-link capacitors. Such electrical issues at the switch and module level magnify stresses across the power transistor, negatively impacting long term reliability of the semiconductor. Furthermore, one of the primary failure mechanisms of power modules can be traced back to environmental effect such as physical and thermal-stress of the wire bond interconnects. These wire bonds are highly susceptible to mechanical fatigue failure as the packaging undergoes thermal and power cycling because the wires become stressed at the substrate interface, die interface, bond heel, and bond knee, all of which become potential points for fracture and failure. Power transistor wire bonds must typically carry electrical current in the range of 10 s of amps or more. This often results in substantial current crowding at the knee or heel of the bond, and at the die-pad interface which again, results in potential points of failure due to localized hot spots and stresses. All of these issues become further exacerbated with the transition to wide bandgap power devices, which are capable of high temperature operations well in excess of 250° C. and these limitations severely limit the 600+° C. that is theoretically achievable. The mechanical fatigue from thermal cycling becomes multiplied by orders of magnitude at these temperatures, and the life-time reliability (i.e. the theory behind accelerated life testing for standard electronics packaging) of a wire bond interconnect begins to drop exponentially. Such wire bond interconnects will clearly have difficulty achieving long term confidence and reliability in wide bandgap power systems, and even in today's low temperature silicon based systems they cannot achieve the 10+ year reliability targets set out by the department of energy for many industry platforms (automotive, solid-state smart grid, etc.).

In high frequency IC applications, wire bonds were eliminated years ago and replaced with new advanced technologies such as flip-chip and ball grid arrays. These processing techniques have barely penetrated into the power switch market, primarily due to the fact that power devices (unlike high frequency ICs) are vertical devices requiring both top-side and backside electrical connections. Flipping the device still leaves the power transistor backside exposed and requiring an electrical connection. Developers have shown metal tabs, straps, and solder contacts all to be feasible for this top-side contact, but they suffer from reliability problems on par with or worse than wire bonding. The most successful wire bondless power package today is the "press pack" or puck, which implements a high pressure contact. This puck is utilized almost exclusively in the high voltage solid-state switching arena where double-sided cooling is an essential requirement. See U.S. Pat. No. 5,346,859, issued to Niwayama on Sep. 13, 1994 entitled Method for fabricating a full press-pack type semiconductor which is hereby incorporated by reference in its entirety.

As semiconductor power switch capabilities continue to improve significantly in current density, switching speeds, temperature of operation, voltage blocking, and integration; the power electronic system level performance "chokepoint" is increasingly traced back to the packaging of the power switch or module. It simply is not achievable for today's commercial high voltage power modules to operate at significantly high switching speeds or frequencies. The energy losses in the power module parasitics are too high, and this in turn limits the capability of the entire power electronic converter system. Module power densities have reached their limits with today's thermal management strategies, which again, are heavily dependent upon the module packaging technology. With the introduction of advanced wide bandgap materials, today's power modules cannot achieve the junction temperatures conducive to taking full advantage of the thermal performance of these new devices. Finally, present power packaging technologies will not survive the new long term reliability requirements demanded by newer fields like automotive and smart grid, which absolutely must deliver reliable service to their customers at all times. It is critical that new investments be made, now, into revolutionary power packaging ideas that can overcome many of these debilitating weaknesses, or smart power electronics will remain elusive.

From these prior references it may be seen that the prior art is very limited in its teaching and utilization, and an improved connection is needed to overcome these limitations.

SUMMARY OF THE INVENTION

The present invention is directed to phase changing power interconnects. In accordance with one exemplary embodiment of the present invention, an interconnect is provide that changes phases from liquid to solid and back to relieve stresses built up due to thermal cycling.

The liquid phase interconnects of the present invention are directed to uses in power modules, high performance motor drive applications and other areas requiring increased high temperature and reliable operation over extended time periods. Liquid Phase Power Connects (LPPCs) with their planar geometries will reduce the power interconnect inductance by an order of magnitude over power wire bonds, a key critical factor in improving the switching speed capability of the power package to greater than 1 MHz. The LPPCs will also enable multi-directional cooling, thus significantly improving the current and power density capability of SiC power modules to be capable of high temperature operation in excess of 250° C. with ultra high efficiencies at greater than 99%. Lastly, the new liquid power connect technology will greatly enhance the lifetime of the power electronics upwards to 20 year reliability. It is important to note that LPPCs are perfectly suited for all semiconductor switch technologies including; Si, SiC, GaN, SiGe, GaAs, diamond, and other more exotic devices.

The present invention is directed to a highly conductive, ultra-low inductance liquid metal power connect that eliminates interconnect stress and mechanical fatigue failure due to thermal/power cycling, thereby extending reliability targets to 20+ years using a simple low cost manufacturing process enabling multi-directional thermal cooling and continuous operation under extreme environments and conditions for extended periods of time.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views:

FIG. 1 is a top view of a liquid phase power connect of the present invention.

FIG. 2 is a bottom view of the liquid phase power connect.

FIG. 3 is a schematic exploded view of the liquid phase power connect.

DETAILED DESCRIPTION OF THE INVENTION

Figure 4:
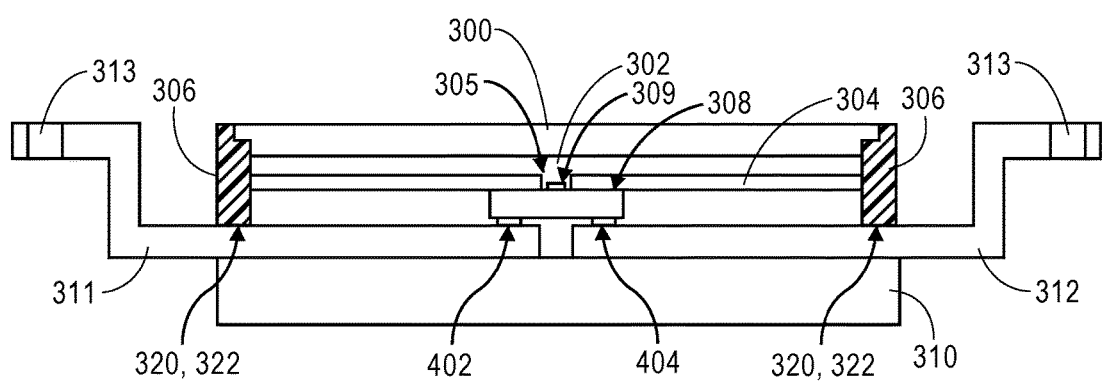
FIG. 4 is a cutaway view of the liquid phase power connect.

The preferred embodiment of the present invention is directed to a liquid phase power connect. As shown in FIGS. 1, 2, 3 and 4 of the drawings this system uses a fundamentally revolutionary concept in which the wire bond (or other topside) interconnect is replaced with a liquid metal in such a manner as to make an ultra high reliability electrical connection between the power transistor and the package power lead. This may be utilized in any number of package designs, from simple discrete packaged diodes, discrete packaged transistors and paralleled transistor switch positions, through and including full power modules (such as a half-bridge). For discussion purposes, the concept is illustrated in FIGS. 1 through 4 as a discretely packaged surface mount component 100 housing a three-terminal power transistor shown as a MOSFET 308.

The power MOSFET 308 electrical device is mounted onto the isolated power substrate 310 in a flip-chip fashion, with the gate pad 402 and source pads 404 oriented down, forming a first bottom contact with the gate pad 402, a top side second contact with a top-side drain contact 309, and a third bottom contact with the source pads 404. This could be achieved with conventional power flip-chip techniques, advanced solders and underfills, or high speed solid-state diffusion processing. The power substrate 310 is patterned to bring the gate and source signals out of the package to the appropriate gate connector 311 and source connector 312 with the appropriate mounting holes 313. The actual package housing 306 is preferably made of a ceramic or silicon, but can be manufactured from a wide range of materials, from ceramics to plastics (as shown in FIG. 4), depending upon ambient temperature and mechanical strength requirements. The housing 306 can be epoxied 320 into place or brazed 322 via metal seal rings to the power substrate 310. With the structure as described so far, however, filling the cavity with a liquid metal alloy would only electrically short the power substrate to the package's top-side drain contact 309. Therefore, the power substrate 310 and MOSFET 308 must be electrically isolated with a high voltage blocking isolator 304 having a contact access aperture 305. This can be as simple as a dielectric or deposited encapsulation across the entire inside base of the package, or a combination of an embedded ceramic isolator and potting compound. Note that in certain application it will be critical that the MOSFET top-side guard rings and side walls are also protected, for which potting or encapsulation serves well. Filling the cavity at this point with the liquid metal 302, and enclosing the package with a brazed or soldered metal lid 300 completes the upper contact. As shown in FIG. 2, the package 100 can be surface mounted into the appropriate circuit and a heatsink can be attached to the backside 104 made up of the bottom of the substrate 310. With this construction, a wide range of package design combinations can be implemented that enable double-sided thermal management strategies.

Obviously, critical to the functionality of the LLPC concept is the liquid metal. The following Material Properties table illustrates some of the key properties of low melting metal alloys in comparison with common packaging metals.

| Material | Liquidus (Degrees Celcius) | Electrical Resistivity (μΩ-cm) | Thermal Conductivity (W/mK) |
| --- | --- | --- | --- |
| Metal Liquid Alloy | | | |
| 100Hg | −38.9 | 95.8 | 8.4 |
| 61.0Ga/25.0In/13.0Sn/1.0Zn | 6.5 | | |
| 62.5Ga/21.5In/16.0Sn | 10.7 | <13 | >40 |
| 75.5Ga/24.5In | 15.7 | <13 | >50 |
| 95Ga/5In | 25 | <13 | >45 |
| 100Ga | 29.8 | 14.7 | 41 |
| 49Bi/21In/18Pb/12Sn | 58 | 4.1 | 10 |
| 51In/32.5Bi/16.5Sn | 60 | 5.7 | 19 |
| 66In/34Bi | 72 | | |
| Common Metals | | | |
| CU | 1084 | 1.7 | 391 |
| Au | 1063 | 2.2 | 315 |
| Ni | 1458 | 7 | 90 |
| Al | 660 | 2.7 | 210 |
| 63Sn/37Pb | 183 | 19.8 | 50 |

Ideally, the metal will remain liquidus throughout its complete range of operating temperatures (−50° C. to 125° C. [for Si] or >250° C. [for wide bandgap]), will have low electrical resistivity, will not react negatively with other materials within the packaging scheme, will have good thermal conductivity, will be non-toxic and non-damaging to the environment, and will be relatively inexpensive.

Taking note of the material properties in the table, one will observe that none of the metals are liquidus completely to the bottom end of the operating range. It is for this reason that the liquid metal is referred to in this proposal as a liquid phase power connect where the interconnect actually has the ability to transition back and forth between a liquid and solid phase. Thus, the phase changing metal may be in a solid state or may melt into a liquid state and may resolidify back into a solid state. Vital to maintaining electrical contact throughout the entire temperature range, including phase changed states, is appropriately designing the coefficient of thermal expansion (CTE) of the package relative to that of the liquid metal alloy. The liquid metal alloy injection and package lidding takes place at the upper operational temperature range of the package. As the package cools, the package contracts at a slightly different rate in comparison to the contraction of the liquid metal alloy to create a small positive pressure inside the package and ensuring good electrical contact across all operating temperatures. Taking the package to low enough temperatures will solidify the power interconnect and the positive pressure will maintain the electrical contact connection. One could envision a condition in which the power package is operated and cycled across a smaller range of cooler temperatures where the power connect remains a solid such that thermal and power cycling will begin to cause stress related mechanical fatigue throughout the power interconnect. One of the revolutionary concepts of the present invention is that this power interconnect is actually self healing. To relieve the stress, simply heat the package up slightly beyond the liquidus temperature of the metal alloy and the interconnect will transition back into a liquid phase for effectively healing any fatigue or fractures. LPPC health management strategies have exotically imaginative far reaching potential. For example, liquid interconnects coupled with advanced controlled channel routing (such as electromagnetically chargeable pathways), could have the ability to redirect power flow around and away from failing components for creating a more robust power module and substantially increasing the lifetime of the electronics.

Returning to the metal liquid alloys outlined in the table, there are several potential candidates for the technology proposed in this program. Mercury is eliminated from consideration due to health hazards. The gallium-indium-tin alloys are the most promising: their liquidus temperatures are below room temperature, and they have less electrical resistivity and near equal thermal conductivity in comparison to industry standard lead-tin solders. All three materials are classified as "non toxic", and all are standard materials in the electronics industry. For one of the preferred metal, note that an interesting and useful property of gallium is that it has what is referred to as "super cooling" characteristics where taking gallium above its liquidus temperature will cause it to transition into a liquid, however, dropping it back below its liquidus temperature is not sufficient to cause it to re-solidify. Gallium further has an advantage of having a constant volume between liquid and solid phases. Also, Gallium actually needs a crystal around which to begin its solidification. Thus, packaging methods can be implemented to maintain gallium in its liquid state even at temperatures below room temperature. The main drawback of this set of alloys is that gallium is known to react with certain metals, such as aluminum, which are often found on transistor pads. There are relatively straightforward working solutions around this problem however, such as the implementation of device Ni pads (which gallium has low reactivity with) or other potential metals. The indium-bismuth-tin alloys are also good LPPC candidates with excellent properties; however, the main drawback here is that their liquidus temperatures are just above room temperature.

Finally, it is worth noting that decades of work have gone into developing automated high speed wire bonding equipment but this equipment is complex, expensive, and delicate and ultimately every single wire bond has to be performed individually. LPPC technology processing on the other hand is well suited to basic injection systems and mass batch processing, similar in speed to mass batch solder reflow processing.

From the foregoing, it will be seen that this invention well adapted to obtain all the ends and objects herein set forth, together with other advantages which are inherent to the structure. It will also be understood that certain features and sub combinations are of utility and may be employed without reference to other features and sub combinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A liquid phase power connect apparatus, comprising:
a power substrate;
at least one electrical connector mounted to the power substrate;
an electrical device having an operating temperature range, the electrical device having a first bottom contact electrically connected to the at least one electrical connector, the electrical device mounted to the power substrate, the electrical device having a top side second contact;
a package housing positioned around the top side second contact of the electrical device;
a phase changing metal positioned in the package housing to electrically contact the top side second contact, the phase changing metal achieving both a liquid state and a solid state within the operating temperature range, the phase changing metal being configured such that any fatigue or fractures caused by the package housing are healed when a temperature reaches a melting point of the phase changing liquid metal;
a third contact;
a dielectric voltage isolator having an aperture to electrically connect the electrical device to the phase changing metal, the dielectric voltage isolator positioned between the third contact and the phase changing metal to inhibit a short between the third contact and the top side second contact; and
a conducting lid connected to the package housing to maintain a position of the phase changing metal, the conducting lid electrically connected to the phase changing metal.

2. The apparatus of claim 1, wherein the electrical device comprises at least one of the following: at least one discrete packaged diode, at least one discrete packaged transistor, at least one paralleled transistor switch, at least one full power module, and at least one MOSFET.

3. The apparatus of claim 1, wherein the electrical device comprises at least one MOSFET.

4. The apparatus of claim 1, wherein the phase changing metal comprises a gallium-indium-tin alloy.

5. The apparatus of claim 1, wherein the phase changing metal comprises an indium-bismuth-tin alloy.

6. The apparatus of claim 1, wherein the package housing comprises at least one of the following: a ceramic, a silicone, and a plastic.

7. The apparatus of claim 1, wherein the package housing is connected to the power substrate with at least one of the following: an adhesive and brazed metal seal rings.

8. The apparatus of claim 1, wherein the dielectric voltage isolator comprises at least one of the following: an embedded ceramic isolator and a potting compound.

9. The apparatus of claim 1, wherein the conducting lid is connected to the package housing with at least one of the following: a brazed arrangement and a soldered arrangement.

10. The apparatus of claim 1, further comprising a heatsink arranged on a back side of the power substrate.

11. A method of relieving stress within an operating electrical device including both a top electrical contact and a bottom electrical contact, the method comprising:
constructing a housing with a conducting substrate with an electrical connector electrically connected to the bottom electrical contact and a conducting lid electrically connected to the top electrical contact, the conducting lid restraining both a liquid and solid phase of a phase changing metal such that the conducting lid is electrically connected as a contact of the electrical device;
providing a dielectric voltage isolator having an aperture to electrically connect the electrical device to the phase changing metal, the dielectric voltage isolator positioned between the phase changing metal and the bottom electrical contact; and
increasing a temperature above the melting point of the phase changing metal to heal any fatigue or fractures caused by the housing during the solid phase of the phase changing metal.

12. The method of claim 11, wherein the electrical device comprises at least one of the following: at least one discrete packaged diode, at least one discrete packaged transistor, at least one paralleled transistor switch, at least one full power module, and at least one MOSFET.

13. The method of claim 11, wherein the electrical device comprises at least one MOSFET.

14. The method of claim 11, wherein the phase changing metal comprises a gallium-indium-tin alloy.

15. The method of claim 11, wherein the phase changing metal comprises an indium-bismuth-tin alloy.

16. The method of claim 11, wherein the housing comprises at least one of the following: a ceramic, a silicone, and a plastic.

17. The method of claim 11, further comprising connecting the housing to the conducting substrate with at least one of the following: an adhesive and brazed metal seal rings,
wherein the conducting lid is connected to the housing with at least one of the following: a brazed arrangement and a soldered arrangement.

18. The method of claim 11, further comprising attaching a heatsink on a back side of the conducting substrate.

* * * * *